United States Patent [19]
Loncar et al.

[11] Patent Number: 6,075,362
[45] Date of Patent: Jun. 13, 2000

[54] DUAL CONTRAST FAST SPIN ECHO WITH ALTERNATING PHASE-ENCODE

[75] Inventors: Mark J. Loncar; Rao P. Gullapalli, both of Richmond Heights, Ohio

[73] Assignee: Picker International, Inc., Highland Heights, Ohio

[21] Appl. No.: 08/688,714

[22] Filed: Jul. 31, 1996

[51] Int. Cl.[7] .................................................. G01V 3/00
[52] U.S. Cl. .......................................... 324/309; 324/307
[58] Field of Search .................................... 324/309, 307, 324/300, 306, 312, 314

[56] References Cited

U.S. PATENT DOCUMENTS

| | | | |
|---|---|---|---|
| 5,229,717 | 7/1993 | Hinks | 324/309 |
| 5,431,163 | 7/1995 | Kajiyama | 128/653.2 |
| 5,528,144 | 6/1996 | Gullapalli et al. | 324/309 |
| 5,557,204 | 9/1996 | Lenz | 324/309 |
| 5,652,513 | 7/1997 | Liu et al. | 324/309 |
| 5,672,970 | 9/1997 | Takai | 324/309 |

OTHER PUBLICATIONS

"Two–Contrast RARE: A Fast Spin–Density and T2–Weighted Imaging Method", Higuchi, et al., JMRI vol. 1, No. 2, p. 147.

"Rapid Spin Echo Imaging (RARE) Producing Two Effective Echo Times By Sharing Views", Fram, et al., pp. 218.

"Comparing the FAISE Method with Conventional Dual–Echo Sequences", Melki, et al., JMRI 1991, 1:319–326.

*Primary Examiner*—Louis Arana
*Attorney, Agent, or Firm*—Fay, Sharpe, Fagan, Minnich & McKee, LLP

[57] ABSTRACT

After exciting magnetic resonance (60), a train of magnetic resonance echoes including echoes (70$_1$, 70$_2$, . . . ) is induced, e.g., with a series of refocusing pulses including pulses (72$_1$, 72$_2$, . . . ). The echoes are phase and frequency-encoded appropriately for generating at least first and second images (94, 98). The first image echoes are interleaved with the second image echoes, for example, odd-numbered echoes for the first image and even-numbered echoes for the second image. To select the effective first/second image echo time, the first/second image echo which follows resonance excitation by a time closest to the selected first/second image effective echo time is given the zero or minimum phase-encoding. Nearby echoes being encoded with low phase-encode angles. In this manner, the effective echo times of the first and second images are selected to have preselected relative contrasts of diagnostic interest. Typically, the effective echo times of both the first and second image is less than the time between resonance excitation and the eighth echo, even although the echo train may be 32, 64, 128, or more echoes.

18 Claims, 4 Drawing Sheets

DUAL CONTRAST FAST SPIN ECHO WITH ALTERNATING PHASE-ENCODE

BACKGROUND OF THE INVENTION

The present invention relates to the magnetic resonance arts. It finds particular application in dual contrast fast spin echo imaging techniques and will be described with particular reference thereto. It is to be appreciated, however, that the invention may also find application in conjunction with other types of multiple echo imaging techniques, particularly techniques with extended echo trains following each excitation.

In magnetic resonance imaging, the echo time, i.e., the time between excitation and the center of the data generating echo, is determinative of significant characteristics of the resultant image. For most imaged tissues, relatively short echo times provide stronger contrast and provide images that are more heavily T1 weighted. As the echo time becomes longer, the resultant images become more heavily T2 weighted. Short echo times cause the image to emphasize tissue with relatively short relaxation times and to emphasize T1 magnetization relaxation; whereas, relatively long echo times emphasize tissue with longer relaxation times and T2 relaxation. Thus, different echo times give different contrasts between various types of tissue within the image. Often, the echo time is selected in order to maximize the contrast between the tissues of interest and to select a relative T1/T2 weighting.

In spin echo imaging, resonance is excited followed by application of a 180° refocusing pulse to induce a first echo. In fast spin echo imaging, the echo is followed by another 180° refocusing pulse to induce a second echo which is followed by another 180° refocusing pulse to induce a third echo, etc. In dual contrast fast spin echoes, the data from a first half of the echo train are used to generate a first image and data from the second half of the echo train are used to generate a second image. In this manner, the effective echo time of the first image is much shorter than the echo time of the second image, hence the two images have different contrasts.

Dual contrast fast spin echoes provide meaningful results when the echo train is relatively short. However, as the echo train becomes longer, the minimum effective echo time of the second image cannot be any shorter than the echo time of the first echo of the second half of the echo train. For long echo trains, such as 64 echoes, 128 echoes, or the like, the effective echo time of the second image becomes so long that the second image is of limited or no diagnostic value. Note that when the effective echo time exceeds the T1 relaxation time and approaches the T2 relaxation time of tissue of interest, the tissue of interest becomes faint or even disappears from the resultant image.

The present invention provides a new and improved imaging technique and apparatus in which data from relatively long echo trains can be used to generate two (or more) images, both with relatively short effective echo times.

SUMMARY OF THE INVENTION

In accordance with one aspect of the present invention, a method of multiple contrast magnetic resonance imaging is provided. Magnetic resonance is excited in selected dipoles in an imaging region. A train of magnetic resonance echoes is induced after each excitation. The echoes of the train are phase and frequency encoded to generate data lines of at least a first image and a second image of the imaging region with first and second effective echo times, respectively. The echoes which are phase and frequency encoded for the second image are interleaved among the echoes which are phase and frequency encoded for the first image. A data line is read out during each echo. The data lines corresponding to the first image are sorted from the data lines corresponding to the second image. The first image data lines are reconstructed into a first image representation and the data lines for the second image are reconstructed into a second image representation. The first and second image representations are selectively combined and the combined image representation is converted into a human-readable display.

In accordance with a more limited aspect of the present invention, the effective echo time for the first image and the effective echo time for the second image are selected. The phase-encoding of the echoes is adjusted such that the first image echoes following the resonance excitation by times closest to the selected first image effective echo time are phase-encoded closest to a central phase-encoding. Similarly, the phase-encoding of the second image echoes which follow the resonance excitation by times closest to the selected second image effective echo time are phase-encoded closest to the central phase-encoding.

In accordance with another aspect of the present invention, a magnetic resonance imaging system is provided. A magnet generates a temporally constant magnetic field through an examination region. A transmitter induces dipoles in the examination region to resonate such that radio frequency resonance signals are generated. Gradient amplifiers and gradient magnetic field coils generate at least slice select, phase, and read magnetic field gradients along orthogonal axes across the examination region. A receiver receives and demodulates radio frequency magnetic resonance signals during the read gradients to produce a series of views. A reconstruction processor reconstructs sets of views into image representations which are stored in an image memory. A sequence controller controls the transmitter and the gradient amplifiers to cause resonance excitation and such that each excitation is followed with a plurality of encoded echoes for generating views of each of a first image and a second image of a common physical region, the first and second images having different effective echo times. The sequence controller generates the echoes to generate the views of the first and second images in an interleaved pattern. The sequence controller causes the gradient amplifier to apply at least read gradients for frequency encoding each echo and phase-encoding gradients with each of a plurality of phase-encoding angles for phase-encoding each echo. An echo time selection device controls the sequence controller for causing the sequence controller to phase-encode echoes of each image closest to a selected echo time for such image with a minimal phase-encoding. A view sorter sorts the views read out from the echoes between the first and second images.

One advantage of the present invention is that it permits longer echo trains and greater inter-echo spacing in dual contrast fast spin echo techniques.

Another advantage of the present invention resides in its flexibility in selecting effective echo times for both images of a dual contrast technique.

Another advantage of the present invention resides in reduced scan times.

Another advantage of the present invention resides in the improved signal-to-noise ratio and reductions in artifacts.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
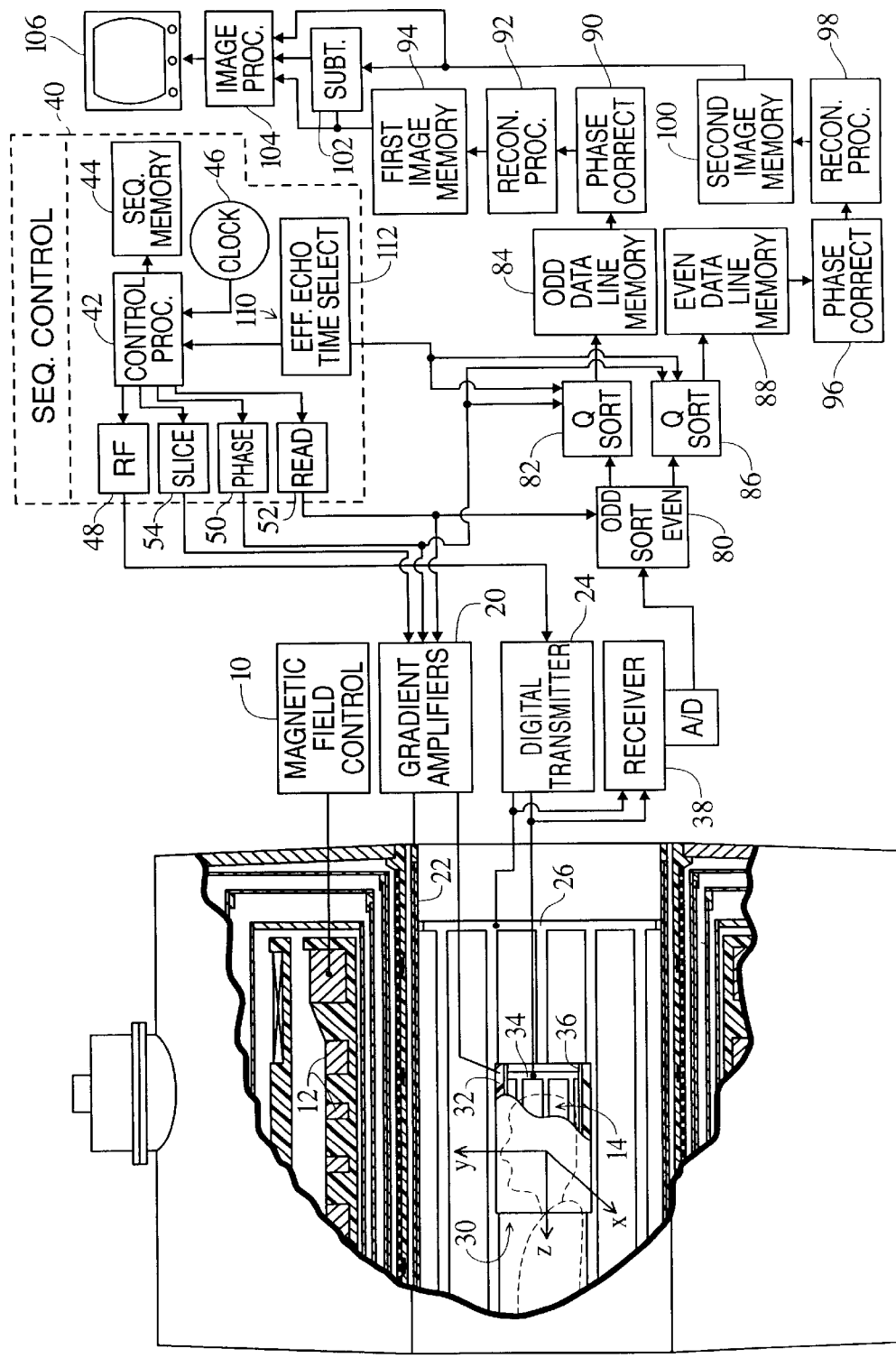
FIG. 1 is a diagrammatic illustration of a magnetic resonance imaging system in accordance with the present invention.

With reference to FIG. 1, a main magnetic field control 10 controls superconducting or resistive magnets 12 such that a substantially uniform, temporally constant magnetic field is created along a z-axis through an examination region 14. A magnetic resonance echo means applies a series of radio frequency (RF) and magnetic field gradient pulses to invert or excite magnetic spins, induce magnetic resonance, refocus magnetic resonance, manipulate magnetic resonance, spatially and otherwise encode the magnetic resonance, to saturate spins, and the like to generate magnetic resonance imaging and spectroscopy sequences. More specifically, gradient pulse amplifiers 20 apply current pulses to selected ones or pairs of whole body gradient coils 22 to create magnetic field gradients along x, y, and z-axes of the examination region 14. A digital radio frequency transmitter 24 transmits radio frequency pulses to a whole body RF coil 26 to transmit RF pulses into the examination region. Each typical radio frequency pulse is composed of a packet of immediately contiguous pulse segments of short duration which taken together with each other and any applied gradients achieve a selected magnetic resonance manipulation, e.g., tip the magnetization by a selected angle such as 90°, 45°, a few degrees, the Ernst angle, or the like. The RF pulses are used to saturate, excite resonance, invert magnetization, refocus resonance, or manipulate resonance in selected portions of the examination region. For whole body applications, the resonance signals are commonly picked up by the whole body RF coil 26.

For generating images of limited regions of the subject, local coils are commonly placed contiguous to the selected region. For example, an insertable head coil 30 is inserted surrounding a selected brain region at the isocenter of the bore. The insertable head coil preferably includes local gradient coils 32 which receive current pulses from the gradient amplifiers 20 to create magnetic field gradients along x, y, and z-axes in the examination region within the head coil. A local radio frequency coil 34 is used to excite magnetic resonance and receive magnetic resonance signals emanating from the patient's head. Alternatively, a receive-only local radio frequency coil can be used to receive resonance signals induced by body-coil RF transmissions. An RF screen 36 blocks the RF signals from the RF head coil from inducing eddy currents in the gradient coils and the surrounding structures. The resultant radio frequency signals are picked-up by the whole body RF coil 26, the local RF coil 34, or other specialized RF coils and demodulated by a receiver 38, preferably a digital receiver.

A sequence control processor 40 controls the gradient amplifiers 20 and the transmitter 24 to perform any one of a plurality of imaging sequences such as fast spin echo (FSE), echo planar (EPI), echo volume (EVI), gradient and spin echo (GSE) and the like. In the preferred fast spin echo embodiment, a control processor 42 retrieves an appropriate fast spin echo sequence from a sequence memory 44. The processor is clocked by a clock or timing control 46 to control a radio frequency pulse circuit 48 which causes excitation, inversion, and other radio frequency pulses at appropriate times in the imaging sequence. The control processor 42 also controls a phase-encode gradient circuit 50 which forms phase-encode gradient pulses of selected amplitudes at the appropriate times in each repetition. The control processor further controls a read gradient circuit 52 which controls the formation of read gradients at appropriate points in the imaging sequence to read out the induced spin echoes or, in gradient echo embodiments, to induce and read out gradient echoes. A third dimension encoding circuit 54 causes the generation of slice select gradients or phase-encoding gradients along a third axis orthogonal to the axis of the phase-encode gradients from the phase-encode gradient circuit 50 and orthogonal to the axis of the read gradients.

Figure 2:
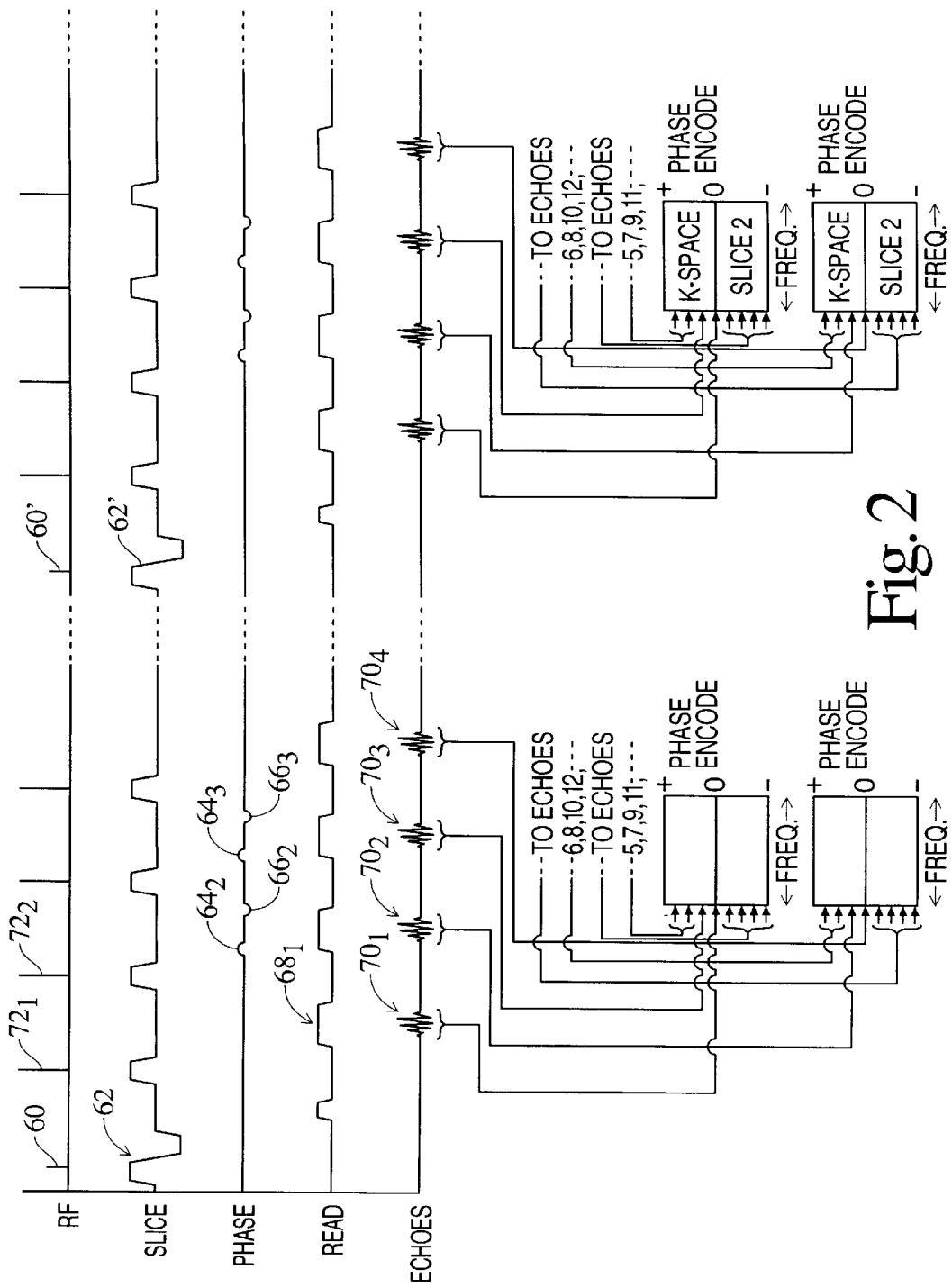
FIG. 2 is a diagrammatic illustration of a preferred imaging sequence in accordance with the present invention.

With reference to FIG. 2, the radio frequency pulse circuit 48 first causes the transmitter 24 to generate a radio frequency excitation pulse 60, e.g., a tailored 90° RF pulse. The third dimension encoding circuit 54 and the gradient amplifiers 20 cause the application of a slice select gradient 62, in the illustrated embodiment, which limits the excitation by RF pulse 60 to a single slice. The phase-encode circuit 50 causes the application of a phase-encode gradient $64_1$, $64_2$, ..., following each RF pulse and, preferably, a rewind phase-encode gradient $66_1$, $66_2$, ..., of equal and opposite magnitude to remove the phase-encoding after each data collection interval. The read gradient circuit 52 and the gradient amplifiers 20 cause a read gradient $68_1$, $68_2$, ..., concurrently with each induced magnetic resonance echo $70_1$, $70_2$, .... More specifically to the fast spin echo sequence, following the radio frequency excitation pulse 60, the radio frequency circuit 48 and transmitter 24 generate a radio frequency refocusing pulse 72 which causes a refocusing of the magnetization into the echo 70. The center of the echo is at an echo time (TE) after the radio frequency excitation 60. More specifically, the center of the echo occurs the same time duration after the refocusing pulse as the time duration by which the refocusing pulse followed the excitation pulse. In the fast spin echo embodiment, a further refocusing pulse $72_2$ is applied after the first echo $70_1$. The further refocusing pulse causes a further refocusing of the magnetization causing a second echo $70_2$ which is phase-encoded by a phase-encode gradient $64_2$ and read out during a read gradient $68_2$. The second echo $70_2$ follows the second refocusing pulse $72_2$ by a time duration which is equal to the time duration between the center of the first echo $70_1$, and the second refocusing pulse $72_2$. The effective echo time of the second echo $70_2$ is the time duration between the excitation pulse 60 and the center of the second echo $70_2$. In this manner, the echo time for each echo becomes progressively longer. Additional refocusing pulses are applied to generate a plurality of echoes, e.g., 16, 32, 64, 128, or more echoes. In the various repetitions, the phase-encode gradient is stepped such that the echoes generate data lines with each of a plurality of phase-encodings.

With reference again to FIG. 1, in the preferred dual contrast embodiment, a first data line sorter 80 sorts the data lines from the even and odd echoes. That is, the first sorter 80 sorts the data lines from the first, third, fifth, seventh, etc., echoes from the data lines from the second, fourth, sixth, eighth, etc., echoes. A second data line sorter 82 sorts the odd echo data lines by phase-encode angle or step, and stores them in an odd image memory 84. Similarly, a third sorter 86 sorts the even data lines in accordance with the phase-encode angle and stores them in an even echo data line memory 88. A phase correction processor 90 corrects the data lines from the odd echo data line memory to correct for system associated phase errors. Data lines from even echoes are inherently motion compensated. A reconstruction processor 92 reconstructs the phase corrected data lines from the odd echo data line memory into a first image representation which is stored in a first image memory 94. Analogously, a phase correction processor 96 corrects the phase of the even echoes and a second reconstruction processor 98 (or the first reconstruction processor working in a time-shared basis) reconstructs the phase corrected data lines from the even echo data line memory 88 into a second image representation that is stored in a second image memory 100. An image combining processor 102 selectively combines the first and second images from memories 94, 100. In the illustrated embodiment, the two images are subtracted pixel by pixel to generate a difference image. Other weighted subtractive combinations or additive combinations, or the like, are also contemplated. A video processor 104 reformats one or more of the first, second, and combined images into appropriate format for display individually or simultaneously on a human-readable video monitor 106.

The sequence control 40 further includes a means 110 for selecting the effective echo time of the first and second images. More specifically, the operator inputs the selected effective echo time for each of the first and second images. Once the effective echo time is input, a circuit or processor 112 of the means 110 adjusts the order in which the phase-encode gradients are applied. More specifically, the odd echo closest to the selected effective odd echo image effective echo time is phase-encoded with a zero or central phase-encoding. The even echo temporally closest to the selected even echo image effective echo time is also phase-encoded with a zero or central phase-encoding. Odd echoes temporally close to the zero phase-encoded odd echo are phase-encoded with low phase-encode angles. Echoes temporally further from the selected effective echo time are phase-encoded with progressively higher phase-encode angles. Similarly, the even echoes temporally closer to the central or zero phase-encoded even echo data line are phase-encoded with lower phase-encode angles, and the even echoes temporally further away are phase-encoded with higher phase-encode angles. The central and low phase-encode angle data lines have the most effect on the resultant image. In this manner, the effective echo time of the odd and even images are selectively adjusted. For a fast spin echo sequence, both image effective echo time typically falls within the first 8 echoes. For sequences with very closely spaced echoes, the longer effective image echo time typically falls within the first 16 echoes. When the echoes, or at least the first few echoes are widely spaced in time, one of the first few echoes is centrally phase-encoded for each image.

As illustrated diagrammatically in FIG. 2, the zero phase-encoded odd echo data line from the first echo $70_1$ is positioned in the center of k-space for the odd echo image of the first slice. The zero phase-encoded data line from the fourth echo $70_4$ is positioned in the center of k-space for the even echo image of the first slice. In the preferred embodiment, the temporally closest odd echoes generate the lowest angle positive and negative phase-encode data lines, and so forth, until the most temporally distant echoes are used to generate the highest positive and negative phase-encode data lines. In the illustrated embodiment, a data line from the third echo $70_3$ is phase-encoded in the lowest positive segment of k-space; the fifth echo in the lowest negative segment of k-space, etc. In this manner, in a 16 echo train, a data line is generated for each eighth of even and odd echo k-space. In subsequent repetitions, additional data lines are generated for each segment. This process is repeated until all segments are complete. In multi-slice imaging, a next RF pulse 60' is accompanied by a slice select pulse 62' which selects a different slice. This process is repeated to collect data from each of the slices in the volume before returning to the first slice. In order to select the effective image echo times more precisely, even and odd echoes can be swapped, timing among the echoes adjusted, or the like.

Figure 3:
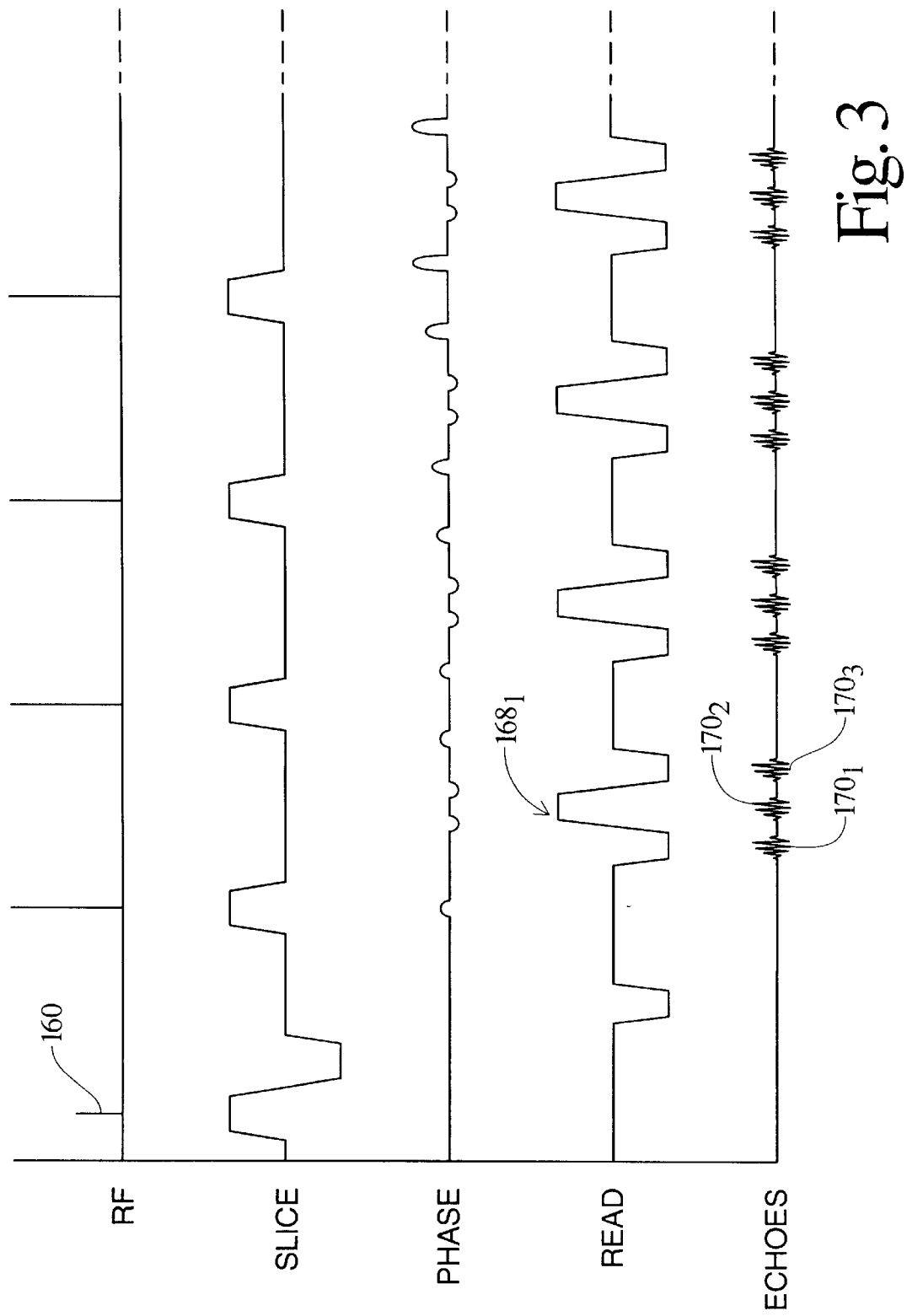
FIG. 3 illustrates an alternate sequence in accordance with the present invention; and, FIG. 4 illustrates yet another alternate embodiment.

In the embodiment of FIG. 3, each radio frequency excitation pulse 160 is followed by a read gradient package $168_1, 168_2, \ldots$. Each read gradient package includes a first polarity portion which is reversed to a second polarity portion inducing a first gradient echo $170_1$. The read gradient is again reversed to generate a read gradient portion contemporaneously with an induced spin echo $170_2$. Due to the gradient reversal, spin and gradient echoes are induced superimposed on each other. The gradient echo complex is again reversed to generate a second gradient echo $170_3$. The spin and gradient echoes, for contrast imaging, are then sorted into two or more sets of data lines. For example, even and odd spin echoes may again be sorted into even and odd images. The gradient echoes immediately preceding and following each spin echo may be utilized to correct the spin echo, or may be utilized in the higher and lower phase-encode angle data lines of the same or the other image.

Figure 4:
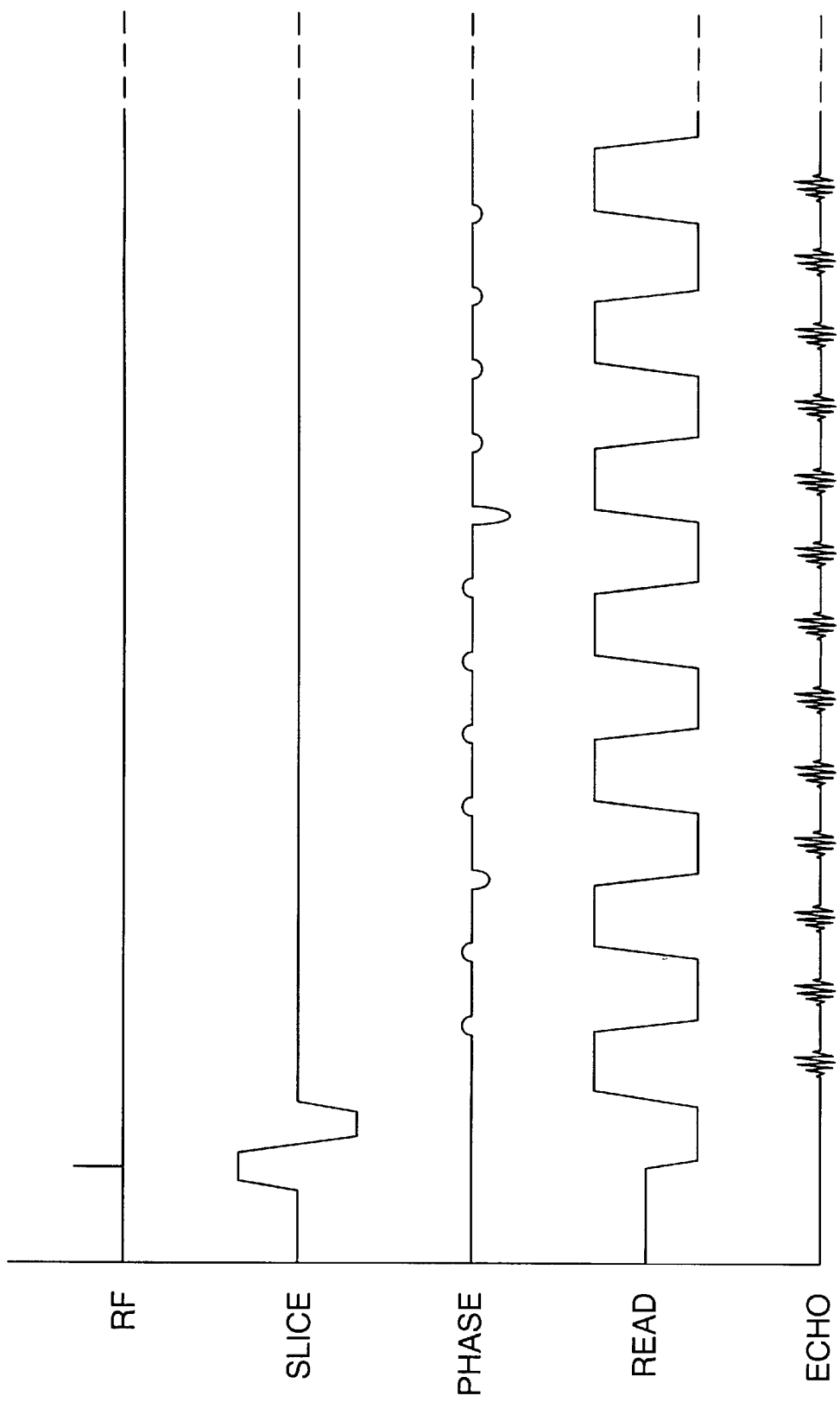

As illustrated in FIG. 4, the present technique is also amenable to use with echo-planar and echo-volume imaging techniques. In echo-planar imaging techniques, the read gradient is reversed repeatedly, each reversal inducing a gradient echo. No RF refocusing pulses are needed. The gradient echoes are again sorted, e.g., by even and odd-numbered echoes, between two or more image sets.

In another alternate embodiment which is amenable to use with either the fast spin echo, the gradient and spin echo, echo-planar imaging, and other techniques, the data lines are sorted in small groups, rather than even/odd. For example, the first and second data lines are sorted to one image, the third and fourth data lines to the second image, the fifth and sixth to the first image, the seventh and eighth data lines to the second image, etc. Analogously, one can sort the data lines in groups of three or more between the images. As another alternate embodiment, some of the data lines, particularly the data lines with the highest phase-encode angles, may be shared by and common to both images.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system which includes a magnet for generating a temporally constant magnetic field through an examination region, a transmitter for inducing dipoles in the examination region to resonance such that radio frequency resonance signals are generated, gradient amplifiers and gradient magnetic field coils for generating at least slice select, phase, and read magnetic field gradient pulses along orthogonal axes across the examination region, a receiver for receiving and demodulating the radio frequency magnetic resonance signals read during the read gradients to produce a series of views, a reconstruction processor for reconstructing sets of views into image representations, and an image memory for storing the image representations, the system further comprising:

a sequence controller for controlling the transmitter and the gradient amplifiers to cause resonance excitation and following each excitation with a plurality of encoded echoes for generating views of each of a first image and a second image of a common physical region with different effective echo times, the sequence controller generating the echoes to generate the views of the first and second images in an interleaved pattern, the sequence controller causing the gradient amplifiers to apply at least read gradients for frequency-encoding each echo and phase-encoding gradients with each of a plurality of phase-encoding angles for phase-encoding each echo;

an echo time selection device which controls the sequence controller for causing the sequence controller to phase-encode echoes of each image closest to a selected echo time for each image with a minimal phase-encoding; and, a view sorter for sorting views read out from the echoes between the first and second images.

2. The magnetic resonance imaging system as set forth in claim 1 wherein the sequence controller phase and frequency-encodes odd-numbered echoes for the first image and even-numbered echoes for the second image; and the sorter sorts views from the odd echoes to a first image data memory and views for the even echoes to a second image data memory.

3. The system as set forth in claim 2 further including:

a first image data sorter for sorting the views from the odd echoes in accordance with phase-encoding and storing the odd echo views in the first image data memory in accordance with such phase-encoding; and, a second image data sorter for sorting the views from the even echoes in accordance with phase-encoding and storing the even echo views in the second image data memory in accordance with such phase-encoding.

4. The system as set forth in claim 2 further including:

an image combining processor for selectively combining the first and second image representations; and, an image processor for converting at least the combined first and second image representations into appropriate format for display on a human-readable monitor.

5. The system as set forth in claim 1 further including:

an image combining processor for selectively combining the first and second image representations; and, an image processor for converting at least the combined first and second image representations into appropriate format for display on a human-readable monitor.

6. The system as set forth in claim 5 further including a phase correction processor for phase correcting the odd and even image data lines.

7. A method of multiple contrast magnetic resonance imaging comprising:

exciting magnetic resonance of selected dipoles within a selected imaging region;

inducing a train of magnetic resonance echoes after each excitation;

phase and frequency-encoding the train of magnetic resonance echoes for generating data lines of at least a first image and a second image of the imaging region with first and second effective echo times, the echoes phase and frequency encoded for the second image being interleaved among the echoes phase and frequency encoded for the first image;

reading out a data line during each echo;

sorting the data lines corresponding to the first image from the data lines corresponding to the second image;

reconstructing the first image data lines into a first image representation;

reconstructing the second image data lines into a second image representation;

converting the image representations into a human-readable display.

8. The method as set forth in claim 7 further including:

selectively combining the first and second image representations and displaying the combined image representations.

9. The method as set forth in claim 7 wherein each echo is induced by applying a radio frequency refocusing pulse.

10. The method as set forth in claim 9 wherein additional echoes are induced by inverting the read gradient.

11. The method as set forth in claim 7 wherein:

in the reading out step, a read gradient of one polarity is applied as each echo is read out; and, in the inducing step, the train of echoes are induced by repeatedly reversing the polarity of the read gradient.

12. The method as set forth in claim 7 further including:

selecting an effective echo time for the first image and an effective echo time for the second image;

adjusting the phase-encoding of the echoes such that first image echoes following the resonance excitation by times closest to the selected first image effective echo time are phase-encoded closest to a central phase-encoding; and, adjusting the phase-encoding of the echoes such that second image echoes following the resonance excitation by times closest to the selected second image effective echo time are phase-encoded closest to the central phase-encoding.

13. The method as set forth in claim 12 wherein the first image echoes are odd-numbered echoes and the second image echoes are even-numbered echoes.

14. The method as set forth in claim 13 further including:

phase-correcting data from the odd-numbered echoes; phase-correcting data from the even-numbered echoes.

15. The method as set forth in claim 12 wherein the first and second images are subtractively combined.

16. The method as set forth in claim 12 wherein more than two images are generated, each with a different selective effective echo time.

17. The method as set forth in claim 12 wherein the echo train includes at least 32 echoes and wherein the effective echo times of both the first and second images are less than the time between resonance excitation and an eighth echo of the echo train.

18. The method as set forth in claim 12 wherein the effective echo time of the first image is selected by selecting one of the first image echoes which follows the resonance excitation by substantially the selected first image effective echo time to be phase-encoded with zero phase-encoding and wherein the effective echo time of the second image is selected by selecting a second image echo which follows the resonance excitation by substantially the selected second image effective echo time to be phase-encoded with zero phase-encoding.

\* \* \* \* \*